US007642857B2

(12) United States Patent
Salove et al.

(10) Patent No.: US 7,642,857 B2
(45) Date of Patent: Jan. 5, 2010

(54) CURRENT LIMIT CIRCUIT FOR COMPENSATING FOR OUTPUT LOAD MISMATCH OF AN RF POWER AMPLIFIER

(75) Inventors: Matthew J. Salove, Portland, OR (US); William H. Davenport, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 84 days.

(21) Appl. No.: 11/507,633

(22) Filed: Aug. 21, 2006

(65) Prior Publication Data

US 2008/0042752 A1 Feb. 21, 2008

(51) Int. Cl.
*H03F 3/04* (2006.01)
(52) U.S. Cl. .................................. 330/298
(58) Field of Classification Search ............. 330/296, 330/298
See application file for complete search history.

(56) References Cited

U.S. PATENT DOCUMENTS

| | | | | |
|---|---|---|---|---|
| 4,331,930 A | * | 5/1982 | Shibata et al. ............ | 330/267 |
| 4,355,341 A | * | 10/1982 | Kaplan ..................... | 361/79 |
| 4,688,002 A | * | 8/1987 | Wingate ................... | 330/298 |
| 5,111,158 A | * | 5/1992 | Malec et al. .............. | 330/297 |
| 6,278,328 B1 | * | 8/2001 | Yamamoto et al. ........ | 330/298 |
| 6,404,287 B2 | * | 6/2002 | Dening et al. ............ | 330/296 |
| 6,515,546 B2 | * | 2/2003 | Liwinski .................. | 330/296 |
| 6,646,511 B2 | * | 11/2003 | Canyon et al. ........... | 330/297 |
| 6,731,171 B2 | * | 5/2004 | Yamashita ................ | 330/285 |
| 6,850,119 B2 | | 2/2005 | Arnott | |
| 6,906,594 B2 | * | 6/2005 | Womac .................... | 330/296 |
| 7,038,546 B2 | * | 5/2006 | Kuriyama ................ | 330/285 |
| 7,049,893 B2 | * | 5/2006 | Winslow .................. | 330/290 |
| 7,145,397 B2 | * | 12/2006 | Yamamoto et al. ........ | 330/298 |
| 7,148,748 B2 | * | 12/2006 | Apel ....................... | 330/279 |
| 7,154,336 B2 | * | 12/2006 | Maeda ..................... | 330/285 |
| 7,439,809 B2 | * | 10/2008 | Iwata et al. ............... | 330/296 |
| 7,440,734 B1 | * | 10/2008 | Jones et al. .............. | 455/115.1 |
| 2005/0059362 A1 | * | 3/2005 | Kalajo et al. ............ | 455/127.1 |

* cited by examiner

*Primary Examiner*—Robert Pascal
*Assistant Examiner*—Khiem D Nguyen
(74) *Attorney, Agent, or Firm*—Booth Udall, PLC

(57) ABSTRACT

An apparatus and method is disclosed for providing control of current consumption of a power amplifier. The power amplifier comprises an output stage for amplifying a RF signal, and the output stage is operably coupled to an output load. The power amplifier further comprises a bias circuit operably coupled to the output stage, wherein the bias circuit is capable of applying a bias voltage to the output stage. The power amplifier still further comprises a limit circuit operably coupled to the bias circuit for detecting an increase in the current of the output stage under an output load mismatch and in response, decreasing the bias voltage applied to the output stage.

15 Claims, 4 Drawing Sheets

US 7,642,857 B2

CURRENT LIMIT CIRCUIT FOR COMPENSATING FOR OUTPUT LOAD MISMATCH OF AN RF POWER AMPLIFIER

TECHNICAL FIELD OF THE INVENTION

The present invention relates generally to radio frequency (RF) power amplifiers and more specifically, to a current limiting circuit for controlling current consumption of a RF power amplifier.

BACKGROUND OF THE INVENTION

Radio frequency (RF) power amplifiers are often used in portable battery operated wireless devices, such as cellular telephones. Extending the battery life is a key concern for users and manufacturers of these battery operated wireless devices. One of the key factors in determining the battery life of the battery operated wireless device is the power consumption of the RF power amplifiers. The RF power amplifiers are designed to operate into an optimal load impedance and are typically coupled to an antenna of the battery operated wireless device.

However, under an antenna mismatch condition, such as for example, when the antenna of the battery operated wireless device approaches objects (e.g. metal structures, human contact, or the like), the load impedance of the RF power amplifier changes and the RF power amplifier draws excess current. In some cases, the current can exceed more than two times the current drawn under an optimal load impedance. When the RF power amplifier draws excess current, the battery life of the battery operated wireless device is reduced. In addition, the adjacent channel power ratio (ACPR) and error vector magnitude (EVM) linearity and distortion limits are often exceeded when the RF power amplifier draws excess current.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of the exemplary embodiments of the present invention. Those skilled in the art will recognize that embodiments of the present invention provide many inventive concepts and novel features that are merely illustrative and not to be construed as restrictive. Accordingly, the specific embodiments discussed herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the invention.

Figure 1:
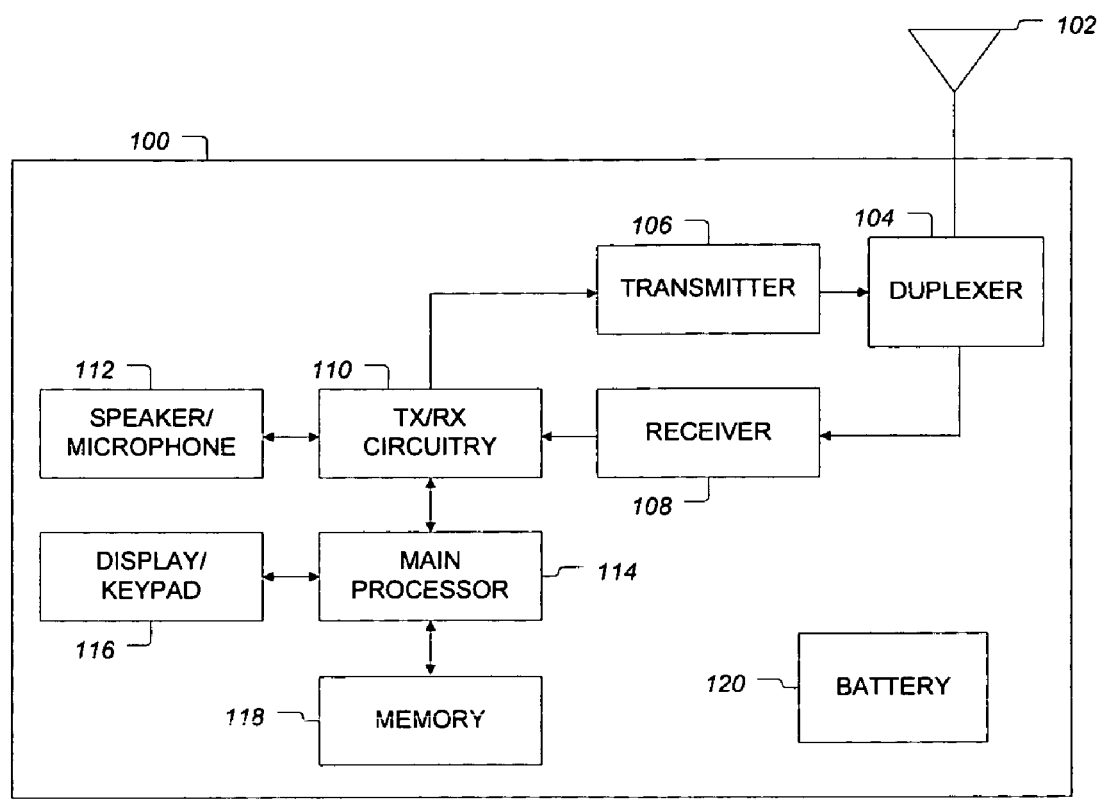
FIG. 1 illustrates a high-level block diagram of a wireless device according to an exemplary embodiment of the present invention.

FIG. 1 illustrates a high-level block diagram of a wireless device 100 according to an exemplary embodiment of the present invention. In one embodiment, wireless device 100 comprises an antenna 102, a duplexer 104, a transmitter 106, a receiver 108, TX/RX circuitry 110, a speaker/microphone 112, a main processor 114, a display/keypad 116, a memory 118, and a battery 120. Wireless device 100 may be any wireless device, including, but not limited to, conventional cellular telephones, paging devices, personal digital assistant devices, text-messaging devices, portable computers, or any other like device capable of wireless communication.

As will be explained below in greater detail with respect to FIGS. 2-4, transmitter 106 comprises radio frequency (RF) power amplifier circuitry including bias circuitry, one or more RF power amplifier stages, and other like circuitry. In one embodiment of the present invention, the RF power amplifier circuitry of transmitter 106 is formed on a Gallium Arsenide (GaAs) substrate. However, other semiconductor materials (e.g., silicon, indium phosphide, gallium nitride) may be used. In addition, for purposes of illustration and ease of explanation, embodiments of the present invention are described in terms of bipolar junction transistor (BJT) technology (e.g., heterojunction bipolar transistors (HBTs)). However, embodiments of the invention are not limited to BJT technology.

TX/RX circuitry 110 receives from antenna 102 an incoming signal transmitted by for example, a communication system or a wireless network provider, through duplexer 104 and receiver 108. TX/RX circuitry 110 processes and sends the incoming signal to the speaker (i.e., voice data) or to main processor 114 (e.g., web browsing) for further processing. Likewise TX/RX circuitry 110 receives analog or digital voice data from the microphone or other outgoing data (e.g., web data, e-mail) from main processor 114. TX/RX circuitry 110 transmits an RF signal that is transmitted through transmitter 106 via antenna 102.

Main processor 114 executes a basic operating system program stored in memory 118 in order to control the overall operation of wireless device 100. For example, main processor 114 controls the reception of signals and the transmission of signals by TX/RX circuitry 110, receiver 108, and transmitter 106. Main processor 114 is capable of executing other processes and programs resident in memory 118 and may move data into or out of memory 118, as required by an executing process.

Main processor 114 is also coupled to display/keypad 116. The user of wireless device 100 uses the keypad to enter data into wireless device 100. The display may be a liquid crystal display capable of rendering text and/or at least various graphics; alternate embodiments may use other types of displays. Battery 120 is operably coupled with the electrical components of wireless device 100, in accordance with known electrical principles.

Those skilled in the art will recognize that wireless device 100 is given by way of example and that for simplicity and clarity, only so much of the construction and operation of wireless device 100 as is necessary for an understanding of the present invention is shown and described. In addition, or as an alternative, although an exemplary wireless device 100 is shown and described, the present invention contemplates any suitable component or combination of components performing any suitable tasks in association with wireless device 100, according to particular needs. Moreover, it is understood that wireless device 100 should not be construed to limit the types of devices in which embodiments of the present invention may be implemented.

In accordance with the principles of embodiments of the present invention, the RF power amplifier circuitry of transmitter 106 of wireless device 100 provides for detecting and limiting the current for an output load mismatch of the RF power amplifier, as described below in greater detail with respect to FIGS. 2-4.

Figure 2:
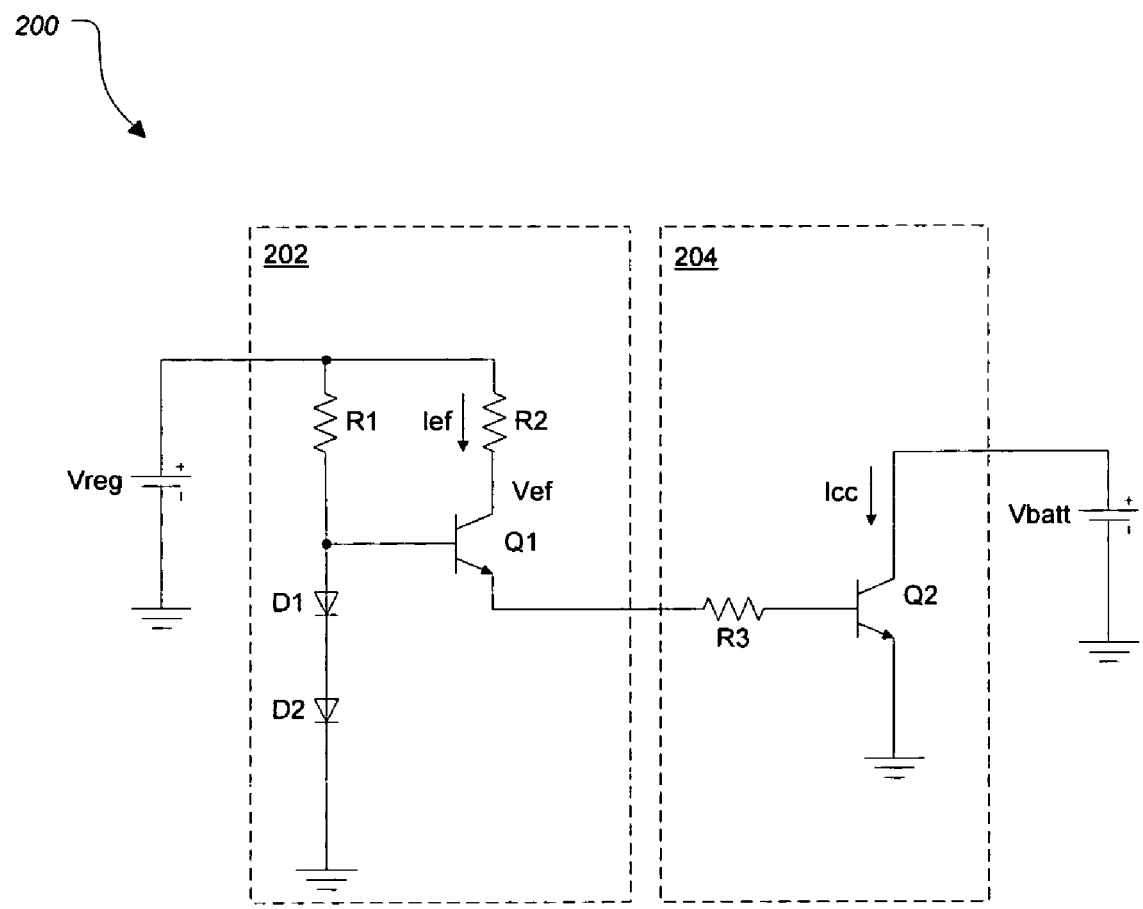
FIG. 2 illustrates a schematic diagram of a current mirror bias circuit according to one embodiment of the present invention.

FIG. 2 illustrates a schematic diagram of a current mirror bias circuit 200 according to one embodiment of the present invention. Current mirror bias circuit 200 comprises a source regulated voltage Vreg, bias circuit 202, output stage 204, and a battery voltage Vbatt. Bias Circuit 202 comprises a transistor Q1, resistors R1 and R2, and diodes D1 and D2. Output stage 204 comprises a transistor Q2 and a resistor R3. For simplicity and clarity, only a single transistor Q2 and a single resistor R3 of output stage 204 are shown and described. Although output stage 204 is shown and described as having a single transistor Q2 and a single resistor R3, any number of transistors or resistors may be used.

In one embodiment of the present invention, transmitter 106 of wireless device 100 of FIG. 1 comprises RF power amplifier circuitry including current mirror bias circuit 200. In addition or as an alternative, transistor Q2 of output stage 204 is a final amplification stage of transmitter 106 and may experience an output load mismatch of antenna 102 of wireless device 100.

In another embodiment of the present invention, transistor Q1 is an emitter-follower transistor, wherein the voltage at the collector of transistor Q1 is set with resistor R2 and is the emitter-follower voltage Vef. In addition, the current through transistor Q1 is the emitter-follower current Ief. In an alternative embodiment of the present invention, a capacitor (not shown) may be combined with resistor R2 for decoupling transistor Q1. Although transistor Q1 is shown and described as an emitter-follower transistor, the present invention contemplates any suitable transistor or combination of transistors performing the same or substantially similar function as the emitter-follower transistor. As will be explained below in greater detail with respect to FIGS. 3 and 4, the emitter-follower voltage Vef of transistor Q1, is capable of being used as a trigger voltage relative to the collector current Icc of the output stage 204 (i.e. transistor Q2).

In still another embodiment of the present invention, transistor Q1 of bias circuit 202 provides the base current for transistor Q2 of output stage 204. When transistor Q2 of output stage 204 is biased, the collector current Icc of output stage 204 is approximately proportional to the current Ief of transistor Q1, via beta (Icc=Ief*beta). In addition, or as an alternative, by maintaining a tight tolerance on the source regulated voltage Vreg, such as for example within +/−100 mV, the emitter-follower voltage Vef (Vreg−[Ief*R2]) is known for any collector current Icc of output stage 204.

Figure 3:
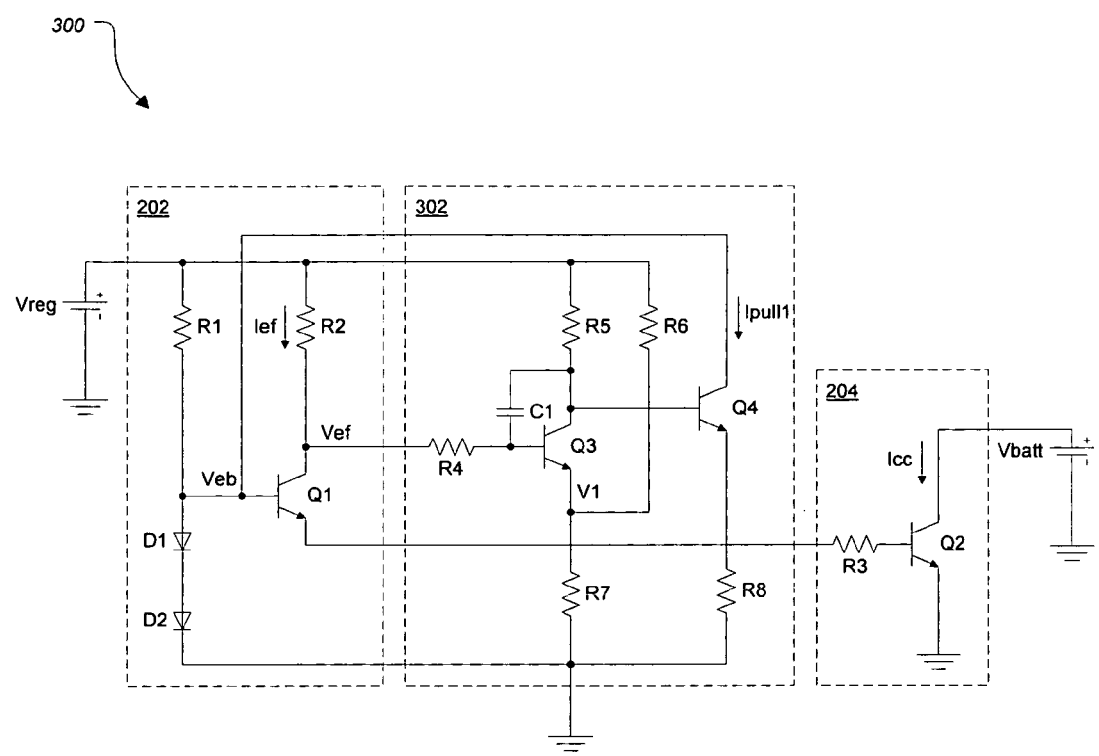
FIG. 3 illustrates a schematic diagram of a current limit circuit according to one embodiment of the present invention.

FIG. 3 illustrates a schematic diagram of a current limit circuit 300 according to one embodiment of the present invention. Current limit circuit 300 comprises source regulated voltage Vreg, bias circuit 202, a limit circuit 302, output stage 204, and battery voltage Vbatt. As indicated above with respect to FIG. 2, bias circuit 202 comprises transistor Q1, resistors R1 and R2, and diodes D1 and D2. Also, as indicated above with respect to FIG. 2, output stage 204 comprises transistor Q2 and resistor R3. Limit circuit 302 comprises transistors Q3 and Q4, a plurality of resistors R4-R8, and a capacitor C1.

The emitter voltage of transistor Q3, voltage V1, may be set with resistors R6 and R7 of limit circuit 302, which provide an adequate collector to emitter voltage of transistor Q1 of bias circuit 202. In addition, as discussed above, the relationship between the collector current Icc of transistor Q2 of output stage 204 and the emitter-follower current Ief of bias circuit 202 is related by beta of transistor Q1. Therefore, the trigger voltage for limit circuit 302 is V1+VbeQ3 and may be adjusted or set by resistors R2, R6, and R7.

In one embodiment of the present invention, transmitter 106 of wireless device 100 of FIG. 1 comprises RF power amplifier circuitry including current limit circuit 300. In addition or as an alternative, transistor Q2 of output stage 204 is a final amplification stage of transmitter 106 of wireless device 100 and may experience an output load mismatch of antenna 102 of wireless device 100.

To further explain the operation of current limit circuit 300, an example is now given. In the following example, wireless device 100 experiences an antenna mismatch condition, such as, for example, when antenna 102 comes in close proximity with objects, for example, metal structures, human contact, or the like. Although a load mismatch of transistor Q2 of output stage 204 is described as a mismatch generated from an antenna mismatch condition, the present invention contemplates any suitable mismatch condition. For example, a load mismatch condition may be any mismatch condition that causes the collector current Icc to increase in transistor Q2 of output stage 204, thereby increasing the power consumption and decreasing the battery life or exceeding the adjacent channel power ratio (ACPR) and error vector magnitude (EVM) limits of wireless device 100. In addition, or as an alternative, a load mismatch condition may be any mismatch to the optimal load impedance presented to transistor Q2 of output stage 204 that causes the collector current Icc to increase in transistor Q2 of output stage 204, thereby increasing the power consumption and decreasing the battery life or exceeding the ACPR and EVM limits of wireless device 100.

In another embodiment of the present invention, during a load mismatch condition of output stage 204, the collector current Icc of transistor Q2 increases, which in turn decreases the emitter-follower voltage Vef of transistor Q1. When the emitter-follower voltage Vef of transistor Q1 decreases below a predetermined trigger voltage, limit circuit 302 detects the increase in the collector current Icc of transistor Q2 and closes the loop back to the emitter base voltage Veb of transistor Q1. Transistor Q4 of limit circuit 302 "pulls" current Ipull1 through resistor R1 of bias circuit 202, thereby decreasing the emitter base voltage Veb of transistor Q1, which in turn limits the emitter-follower current Ief through resistor R2.

Since the emitter-follower current Ief is limited, the emitter-follower voltage Vef of transistor Q1 is prevented from going more negative and is limited relative to the voltage V1 of limit circuit 302. As mentioned above, the emitter-follower current Ief through resistor R2 of bias circuit 202 is equivalent to the base current for transistor Q2 of output stage 204. Therefore, limiting the emitter-follower current Ief also limits the base current of transistor Q2 and effectively limits the collector current Icc of output stage 204. Resistor R4 and capacitor C1 control the loop stability of limit circuit 302 and in particular transistor Q3. In addition, resistor R8 may be used to control the gain of limit circuit 302.

Figure 4:
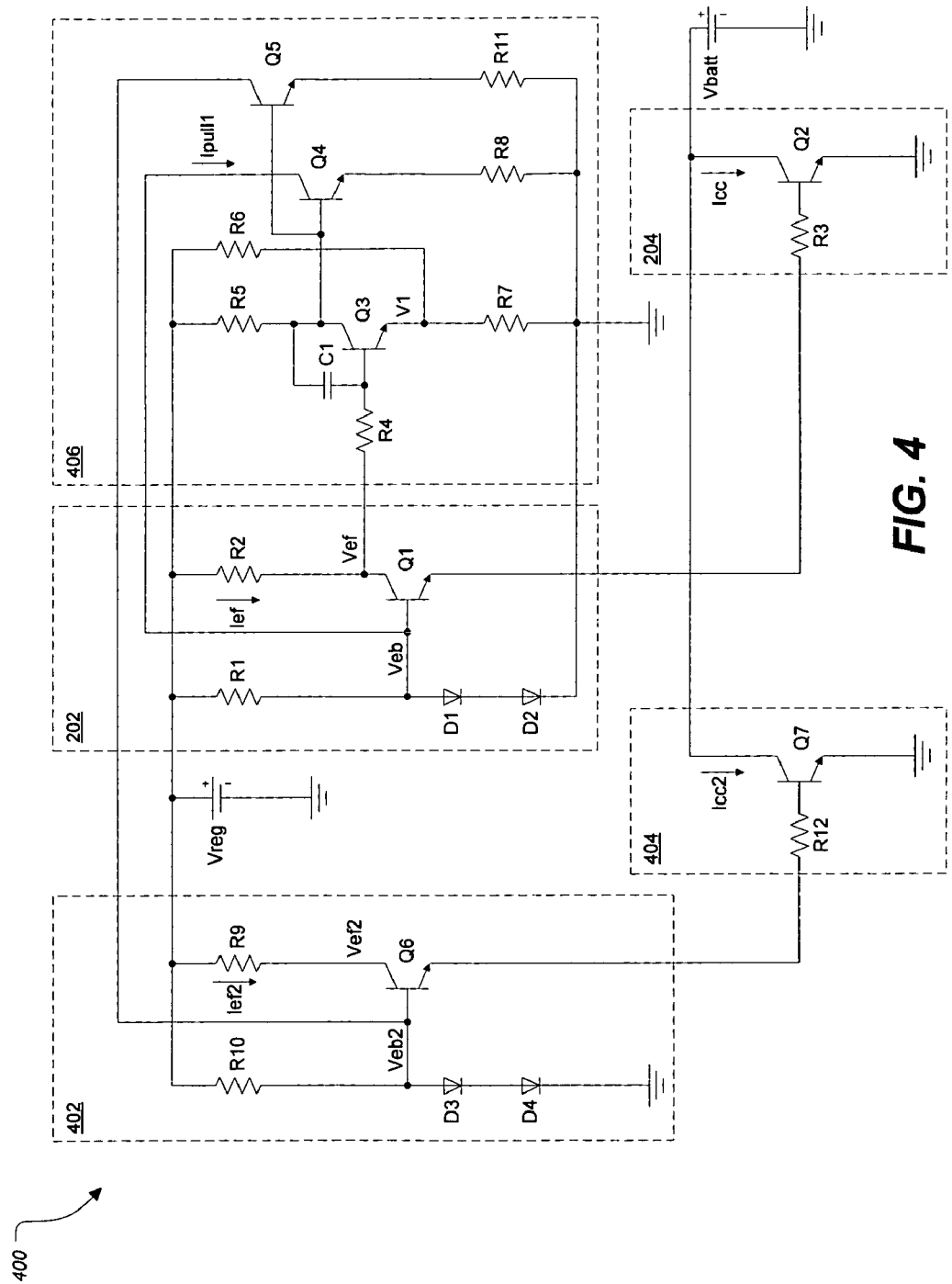
FIG. 4 illustrates a schematic diagram of a current limit circuit according to another embodiment of the present invention.

FIG. 4 illustrates a schematic diagram of a current limit circuit 400 according to another embodiment of the present invention. Current limit circuit 400 comprises source regulated voltage Vreg, bias circuit 202, a bias circuit 402, a limit circuit 406, output stage 204, a driver RF power amplifier stage 404, and battery voltage Vbatt. As indicated above with respect to FIG. 2, bias circuit 202 comprises a transistor Q1, resistors R1 and R2, and diodes D1 and D2. Also, as indicated above with respect to FIG. 2, output RF power amplifier stage 204 comprises a transistor Q2 and a resistor R3. Bias circuit 402 comprises a transistor Q6, resistors R9 and R10, and diodes D3 and D4. Bias circuit 402 operates substantially similar to bias circuit 202, as described above with respect to FIGS. 2 and 3, except bias circuit 402 controls the bias of transistor Q7 of driver RF power amplifier stage 404.

Driver RF power amplifier stage 404 comprises a transistor Q7 and a resistor R12. Although driver RF power amplifier stage 204 is shown and described as having a single transistor Q7 and a single resistor R12, any number of transistors or resistors may be used. Limit circuit 406 comprises transistors Q3-Q5, a plurality of resistors R4-R8 and R11, and a capacitor C1.

As discussed above, the emitter voltage of transistor Q3, voltage V1, may be set with resistors R6 and R7 of limit circuit 302, which provides an adequate collector to the emitter voltage of transistor Q1 of bias circuit 202. In addition, as discussed above, the relationship between the collector current Icc of transistor Q2 of output stage 204 and the emitter-follower current Ief of bias circuit 202 is related by beta of transistor Q1. Therefore, the trigger voltage for limit circuit 406 is V1+VbeQ3 and in addition may be adjusted or set by resistors R2, R6, and R7.

In an embodiment of the present invention, transmitter 106 of wireless device 100 of FIG. 1 comprises RF power amplifier circuitry including current limit circuit 400. In addition or as an alternative, transistor Q7 of driver RF power amplifier stage 404 is a driver amplification stage, and transistor Q2 of output stage 204 is a final amplification stage of transmitter 106 of wireless device 100. Output stage 204, which is driven by driver RF power amplifier stage 404, may experience an output load mismatch due to any change in the optimal load impedance associated with transmitter 106 of wireless device 100.

As an example only and not by way of limitation, when wireless device 100 experiences a load mismatch condition, such as for example, due to a mismatch of the optimal load impedance presented to transistor Q2 of output stage 204, the collector current Icc of output stage 204 increases, and the emitter-follower voltages Vef and Vef2 of transistors Q1 and Q6, decrease respectively. When the emitter-follower voltage Vef of transistor Q1 decreases below a predetermined trigger voltage, limit circuit 406 detects the increase in the collector current Icc of transistor Q2 and closes the loop back to the emitter base voltages Veb and Veb2 of transistors Q1 and Q6, respectively.

Transistors Q4 and Q5 of limit circuit 406 "pulls" current through resistors R1 and R10 of bias circuits 202 and 402, thereby decreasing the emitter base voltage Veb and Veb2 of transistors Q1 and Q6, which in turn limits the emitter-follower current Ief through resistor R2 and the emitter-follower current Ief2 through resistor R9, respectively. Since the emitter-follower current Ief and Ief2 is limited, the emitter-follower voltage Vef and Vef2 of transistors Q1 and Q6 are prevented from going more negative and are limited relative to the voltage V1 of limit circuit 406.

As mentioned above, the emitter-follower current Ief through resistor R2 of bias circuit 202 is equivalent to the base current for transistor Q2 of output stage 204. Therefore, limiting the emitter-follower current Ief also limits the base current of transistor Q2 and effectively limits the collector current Icc of output stage 204. Likewise, the emitter-follower current Ief2 through resistor R9 of bias circuit 402 is equivalent to the base current for transistor Q7 of driver RF power amplifier stage 404. Therefore, limiting the emitter-follower current Ief2 also limits the base current of transistor Q7 and effectively limits the collector current Icc of driver RF power amplifier stage 404. Resistor R4 and capacitor C1 control the loop stability of limit circuit 406 and in particular transistor Q3. In addition, resistors R8 and R11 may be used to control the gain of limit circuit 406.

In another embodiment of the present invention, when current circuit 406 detects the increase in the collector current Icc of transistor Q2, transistor Q5 of limit circuit 406 provides a first feedback path to output stage 204 and a second feedback path back to the preceding gain stage, to reduce the gain and drive of, for example, driver RF power amplifier stage 404. In addition or as an alternative, the reduction of drive from driver RF power amplifier stage 404 provides for an additional level of control to limit the base current of transistor Q2 and, therefore, the collector current Icc of output stage 204. As a result, the power consumption is reduced, the battery life is increased, and the ACPR and EVM performance is maintained within the limits of wireless device 100.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of the present invention. Accordingly, the invention is not limited to the embodiments disclosed, but rather by the appended claims and their equivalents.

What is claimed is:

1. A power amplifier, comprising:
   an output stage for amplifying a radio frequency (RF) signal, the output stage operably coupled to an output load;
   a bias circuit operably coupled to the output stage, the bias circuit capable of applying a bias voltage to the output stage, wherein the bias circuit comprises:
   a bias transistor having a base, a collector, and an emitter, the emitter of the bias transistor operably coupled to the output stage;
   a voltage circuit for setting a collector voltage of the bias transistor, the voltage circuit operably coupled to a voltage and to the collector of the bias transistor; and
   a plurality of diodes operably coupled in series between the base of the bias transistor and a ground; and
   a limit circuit operably coupled to the bias circuit for detecting an increase in the current of the output stage under an output load mismatch and in response, decreasing the bias voltage applied to the output stage.

2. The power amplifier of claim 1, wherein the voltage provided to the voltage circuit is a regulated voltage.

3. The power amplifier of claim 1, wherein the bias transistor is an emitter-follower transistor.

4. The power amplifier of claim 1, wherein the output stage comprises:

an output transistor having a base and a collector, the collector of the output transistor operably coupled to the output load;

a voltage operably coupled to the collector of the output transistor; and at least one resistor operably coupled between the base of the output transistor and the emitter of the bias transistor.

5. The power amplifier of claim 4, wherein the voltage operably coupled to the output transistor is a battery voltage.

6. The power amplifier of claim 4, wherein the limit circuit is further capable of detecting an increase in the current through the collector of the output transistor and in response, limiting the current through the base of the output transistor.

7. The power amplifier of claim 4, wherein the limit circuit comprises:

a first limit transistor having a base, a collector, and an emitter, the base of the first limit transistor operably coupled through at least one resistor to the collector of the bias transistor;

a voltage divider circuit for setting an emitter voltage of the first limit transistor, the voltage divider circuit operably coupled to a voltage and to the emitter of the first limit transistor; and a second limit transistor having a base, a collector, and an emitter, the base of the second limit transistor operably coupled to the collector of the first limit transistor, the collector of the second limit transistor operably coupled to the base of the bias transistor, and at least one resistor operably coupled between the emitter of the second limit transistor and the ground.

8. The power amplifier of claim 7, wherein the bias circuit is a first bias circuit, the power amplifier further comprising:

a driver stage for amplifying an RF signal, the driver stage operably coupled to the output stage; and a second bias circuit operably coupled to the driver stage, the second bias circuit capable of biasing the driver stage.

9. The power amplifier of claim 8, wherein the limit circuit further comprises a third limit transistor having a base, a collector, and an emitter, the base of the third limit transistor operably coupled to the base of the second limit transistor, the collector of the third limit transistor operably coupled to the second bias circuit, and at least one resistor operably coupled between the emitter of the third limit transistor and the ground.

10. The power amplifier of claim 1, wherein the power amplifier is fabricated in Gallium Arsenide (GaAs).

11. A wireless device comprising:

a transmitter for transmitting RF signals, the transmitter comprising:

an output power amplifier stage;

a bias circuit operably coupled to the output power amplifier stage, the bias circuit capable of applying a bias voltage to the output power amplifier stage of the transmitter, wherein the bias circuit comprises:

a bias transistor having a base, a collector, and an emitter, the emitter of the bias transistor operably coupled to the output power amplifier stage;

a voltage circuit for setting a collector voltage of the bias transistor, the voltage circuit operably coupled to a voltage and to the collector of the bias transistor; and a plurality of diodes operably coupled in series between the base of the bias transistor and a ground;

a limit circuit operably coupled to the bias circuit for detecting an increase in the current of the output power amplifier stage and in response, decreasing the bias voltage applied to the output power amplifier stage;

a battery operably connected to the transmitter of the wireless device; and an antenna operably coupled to the output power amplifier stage of the transmitter.

12. The wireless device of claim 11, wherein the output power amplifier stage comprises:

an output transistor having a base and a collector, the collector of the output transistor operably coupled to the antenna and to the battery; and at least one resistor operably coupled between the base of the output transistor and the emitter of the bias transistor.

13. The wireless device of claim 12, wherein the limit circuit comprises:

a first limit transistor having a base, a collector, and an emitter, the base of the first limit transistor operably coupled through at least one resistor to the collector of the bias transistor;

a voltage divider circuit for setting an emitter voltage of the first limit transistor, the voltage divider circuit operably coupled to a voltage and to the emitter of the first limit transistor; and a second limit transistor having a base, a collector, and an emitter, the base of the second limit transistor operably coupled to the collector of the first limit transistor, the collector of the second limit transistor operably coupled to the base of the bias transistor, and at least one resistor operably coupled between the emitter of the second limit transistor and the ground.

14. The wireless device of claim 12, wherein the bias circuit is a first bias circuit, and wherein the transmitter further comprises:

a driver stage for amplifying an RF signal, the driver stage operably coupled to the output power amplifier stage; and a second bias circuit operably coupled to the driver stage, the second bias circuit capable of biasing the driver stage.

15. The wireless device of claim 12, wherein the limit circuit further comprises a third limit transistor having a base, a collector, and an emitter, the base of the third limit transistor operably coupled to the base of the second limit transistor, the collector of the third limit transistor operably coupled to the second bias circuit, and at least one resistor operably coupled between the emitter of the third limit transistor and the ground.

* * * * *